US005867424A

United States Patent [19]
Briner

[11] Patent Number: 5,867,424
[45] Date of Patent: *Feb. 2, 1999

[54] MEMORY ARRAY HAVING A REDUCED NUMBER OF METAL SOURCE LINES

[75] Inventor: Michael S. Briner, San Jose, Calif.

[73] Assignee: Micron Technology, Inc., Boise, Id.

[ * ] Notice: The term of this patent shall not extend beyond the expiration date of Pat. No. 5,631,864.

[21] Appl. No.: 829,602

[22] Filed: Mar. 31, 1997

Related U.S. Application Data

[63] Continuation of Ser. No. 509,036, Jul. 28, 1995, Pat. No. 5,631,864.

[51] Int. Cl.⁶ .................................................. G11C 16/04
[52] U.S. Cl. ................................. 365/185.05; 364/185.12
[58] Field of Search ........................ 365/185.06, 185.05, 365/185.11, 185.12, 185.13, 185.23

[56] References Cited

U.S. PATENT DOCUMENTS

| | | | |
|---|---|---|---|
| 5,175,704 | 12/1992 | Minagawa et al. | 365/189.01 |
| 5,295,105 | 3/1994 | Atsumi | 365/218 |
| 5,325,327 | 6/1994 | Ema | 365/185 |
| 5,371,706 | 12/1994 | Krentz et al. | 365/201 |
| 5,477,499 | 12/1995 | Van Buskirk | 365/218 |
| 5,631,864 | 5/1997 | Briner | 365/185.05 |
| 5,671,177 | 9/1997 | Ueki | 365/185.11 |
| 5,682,350 | 10/1997 | Lee | 365/185.13 |

*Primary Examiner*—David Nelms
*Assistant Examiner*—Son Mai
*Attorney, Agent, or Firm*—Schwegman, Lundberg, Woessner & Kluth, P.A.

[57] ABSTRACT

A flash memory array having a reduced number of metal source lines and increased storage density. The cells are arranged in rows and columns, with the cells in a row having their control gates connected to a common word line and the cells in a column having their drains connected to a common bit line. All of the cell sources of the array are connected together with a combination of doped semiconductor and metal lines. The source metal lines are disposed generally in parallel with the bit lines. In order to reduce the number of source metal lines, the lines are spaced apart by, typically, eight, sixteen or more cell columns. The metal source lines define a sub-array therebetween. The array includes a decoder for accessing two cells in different columns of each sub-array during single reading and programming operations. Thus, each sub-array provides two bits of data rather than the customary one bit. The reduced number of metal source lines saves a significant amount of die area with a only a small sacrifice in increased effective source line resistance.

27 Claims, 4 Drawing Sheets

MEMORY ARRAY HAVING A REDUCED NUMBER OF METAL SOURCE LINES

This is a continuation of application Ser. No. 08/509,036, filed Jul. 28, 1995 now U.S. Pat. 5,631,864.

BACKGROUND OF THE INVENTION

1. Field of the Invention

This invention relates to memory arrays, and in particular to a memory array of flash memory cells having a plurality of sub-arrays separated by metal source lines in which the number of metal source lines is reduced so as to reduce the size of the array 2. Description of the Related Art The use of non-volatile memories, particularly flash memories, has greatly increased. There are several types of flash memory arrays used in such memories. One type of conventional array 10 is called a NOR-type array as depicted in FIG. 1. The memory cells 38 of the array each include a source, a drain and a channel region intermediate to the source and drain. A floating gate is disposed above, and insulated from the channel region and a control gate is disposed above the floating gate. In order to reduce any ambiguity regarding the distinction between the source and drain, for the N channel memory cells, the drain is defined herein as the element which is positive with respect to the source during memory read operations.

The flash cells 38 are arranged in rows and columns, with each of the cells in a particular row having its control gate connected to a common word line $WL_N$. All of the cells in a particular column have their drains connected to a common bit line 40. In addition, all of the sources in the array are connected together. Note that some memory systems include arrays having multiple blocks of cells, with the sources of the cells in the same block connected together so as to permit the blocks to be erased separately. When the cells are read, the sources are all usually grounded, with the common designation for ground being $V_{SS}$. Thus, the source lines are sometimes referred to as $V_{SS}$ lines or connections. As will be explained, the array 10 of FIG. 1 is arranged into sub-arrays, including sub-array 11 and sub-arrays 32 and 36 disposed on either side of sub-array 11. Only a single column of sub-arrays 32 and 36 is depicted.

The sources of the cells 38 are typically connected together by way of non-metallic lines 42, such as diffused semiconductor lines, since metal lines occupy a large amount of area. These semiconductor source lines 42 are shown in FIG. 1 running along side the word lines $WL_N$, with the resistance of the semiconductor source lines being represented by lumped resistors $R_S$. A source line 42 is shared with two word lines. The semiconductor lines 42 have a much greater resistance as compared to metal lines and such resistance tends to both reduce the effective cell read current and makes cell programming more difficult by either increasing the amount of time required to program the cells and/or requiring higher programming voltage to program the cell. Thus, metal source lines are used in combination with the semiconductor lines so as to reduce the overall source line resistance. As can be seen in FIG. 1, the metal source lines 28, 29 and 30 are effectively connected in parallel with the semiconductor lines.

The metal lines include a plurality of column segments 28 and 30 which extend generally parallel with the columns of cells and a row segment 29 which extends along the bottom of the array interconnecting all of the column segments 28 and 30 together. Typical flash memory arrays may have from 128 to 2048 rows. Typically, a sub-array will have 8, 16 or 32 columns of cells which are disposed intermediate to the metal source line column segments 28 and 30 so as to reduce the number of such metal lines, which, as previously noted, consume a large amount of die area. In the FIG. 1 example, the sub-arrays contain 16 columns of cells 38 between the metal source line column segments 28 and 30.

As previously noted, FIG. 1 shows one memory sub-array 11 and one column of the two adjacent memory sub-arrays 32 and 36. A typical array may have 8, 9, 16, 18, 32 or more of such sub-arrays depending upon further decoding and the number of output pins.

As is well known, in order to read a particular cell 38 it is necessary to apply appropriate voltages to the cell by way of the associated word line $WL_0$–$WL_N$ and the associated bit line 40. The common source line is usually grounded. Part of the memory address of the cell to be read provided by an associated processor or the like is decoded in the memory by an X decoder (not depicted) so as to apply a read voltage to the word line $WL_N$ connected to the cell. The remainder of the address is applied to a Y decoder which will connect an appropriate voltage to the bit lines 40 associated with the cell being read. At the same time, a sense amplifier (not depicted) is connected to the bit line 40 for use in sensing the read current.

As can be seen in FIG. 1, the Y decoder (only a small portion of which is disclosed) includes a select transistor N associated with each cell column and connected to the bit line 40 of the column. Each of the 16 select transistors N receives a one of 16 select signal $Y_0$–$Y_{15}$. Only one of the select signals $Y_N$ is made active at any one time during memory read operations so that only one of the 16 select transistors N connected to the common data line $DL_N$ is turned on during a read operation.

In a typical memory system, each address contain a word of data, with each word having 8, 16 or more bits. If, for example, each word is 8 bits, a single select transistor N will be turned on in 8 separate memory sub-arrays so that a total of 8 bits will be read out in each read operation. For example, the decoded address may cause select signal $Y_4$ to go active in 8 separate sub-arrays so that 8 bits are simultaneously connected to separate data line $DL_N$ and read out of the memory for a given address.

Typical memory systems also provide that individual cells can be programmed. Such programming sequences are well known and need not be described. However, in such sequences, only one of the cells in a particular sub-array is programmed at one time. Thus, as was true in the case of cell reading, only one select signal $Y_N$ of the 16 signals applied to sub-array 11 is made active in a programming operation. Again, a total of 8, 16 or more bits can be programmed at one time depending upon the length of the individual words.

In many memories, there are a plurality of blocks which can be separately erased, as previously noted. In a typical 4 megabit memory with a 16 bit data bus, there are sometimes blocks as small as 64 Kilobits. Such blocks, with the prior art of reading one output per sub-array, could be organized with no more than 256 rows with 16 columns per sub-array because a minimum of 256 columns (16 columns per sub-array times 16 bits being operated on in parallel) would be required; that is unless, there are less columns per sub-array. Eight columns per sub-array would add twice as many metal source lines to the array, but would then allow this 64 Kilobit array to be organized as 512 rows by 128 columns. With the present invention which allows operating on two bits per sub-array, the 64 Kilobit array could be organized as 512 rows by 128 columns with the sub-array having 16 columns per metal source lines. Thus the invention can result in a saving in the overhead of metal source lines in the array while allowing the array to be organized with twice as many rows.

The present invention functions to reduce the number of metal source lines column segments so as to reduce the area occupied by these metal source lines. This is accomplished without significantly increasing the overall source line resistance so that memory reading and programming is not adversely affected. These and other advantages of the present invention will be apparent to those skilled in the art upon a reading of the following Detailed Description of the Invention together with the drawings.

SUMMARY OF THE INVENTION

A memory array for use in a memory system is disclosed. The array is comprised of non-volatile memory cells preferably flash memory cells. Each of the cells includes a source, a drain, a channel region intermediate the source and drain, a floating gate disposed over the channel region and insulated from the channel region and a control gate disposed over the floating gate and insulated from the floating gate. The cells being arranged in a plurality of rows and columns, with the cells located in one of the rows having their control gates connected to a common word line and with the cells located in a particular one of the columns having their drains connected to a common bit line and with all of the cells of the array having their sources connected to a common source connection.

The common source connection includes a plurality of doped semiconductor source lines which connect the sources of the cells located in one of the rows together, and a metal source line structure. The metal source line structure includes a plurality of metal source line column segments disposed generally parallel to the bit lines and connects together the doped source lines, with the metal source line column segments being spaced N number of cell columns apart so as to define a plurality of sub-arrays of the cells, with each sub-array having N number of columns.

The array further includes decoder means for accessing at least two cells in one of the sub-arrays at the same time for the purpose of reading the at least two cells. The cells are preferably located in separate cell columns spaced N/2 number of cell columns apart in the cell sub-array.

DETAILED DESCRIPTION OF THE INVENTION

Figure 1:
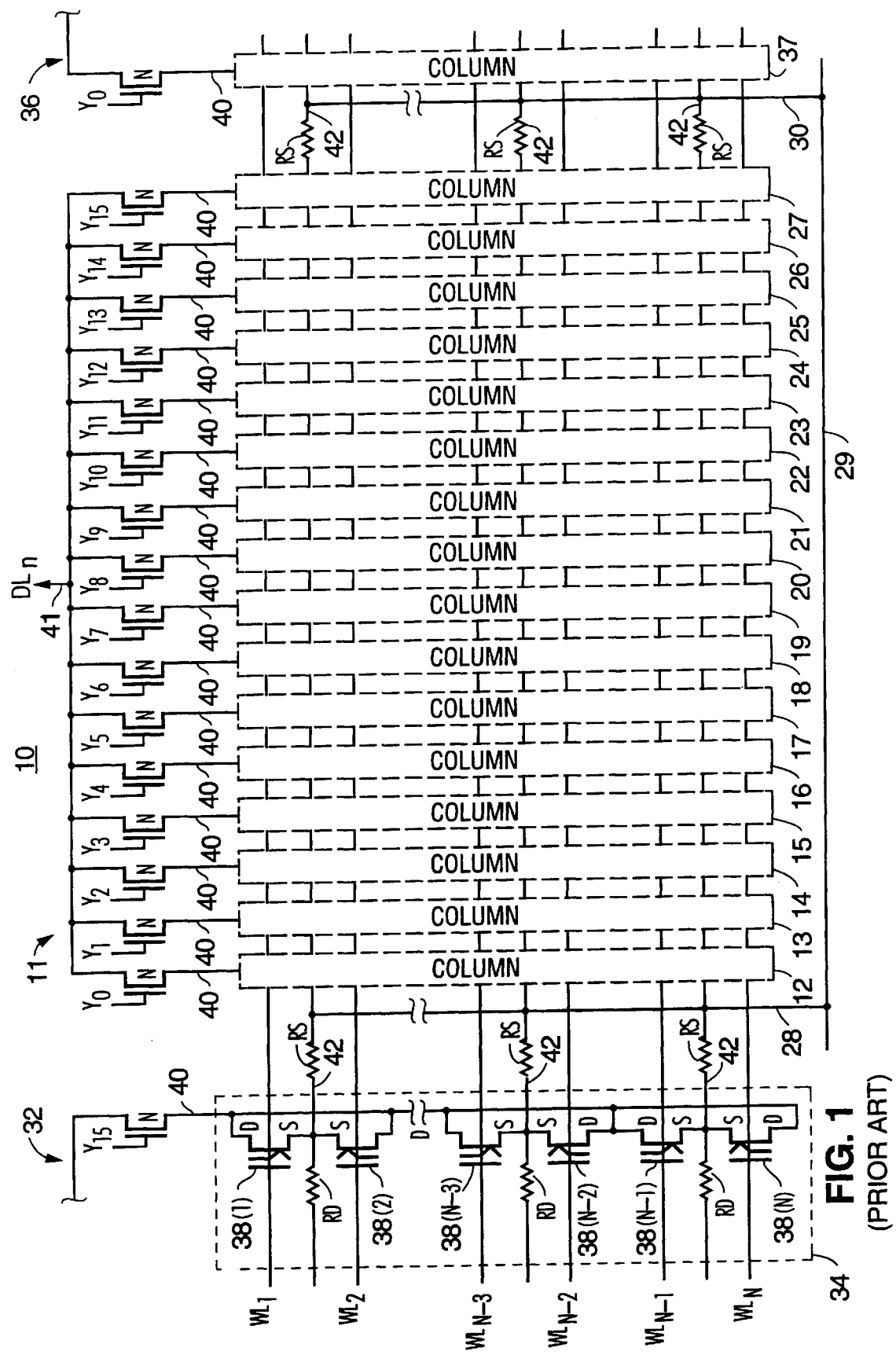
FIG. 1 is a schematic diagram of a typical prior art decoding arrangement for NOR type flash memory array.
Figure 2:
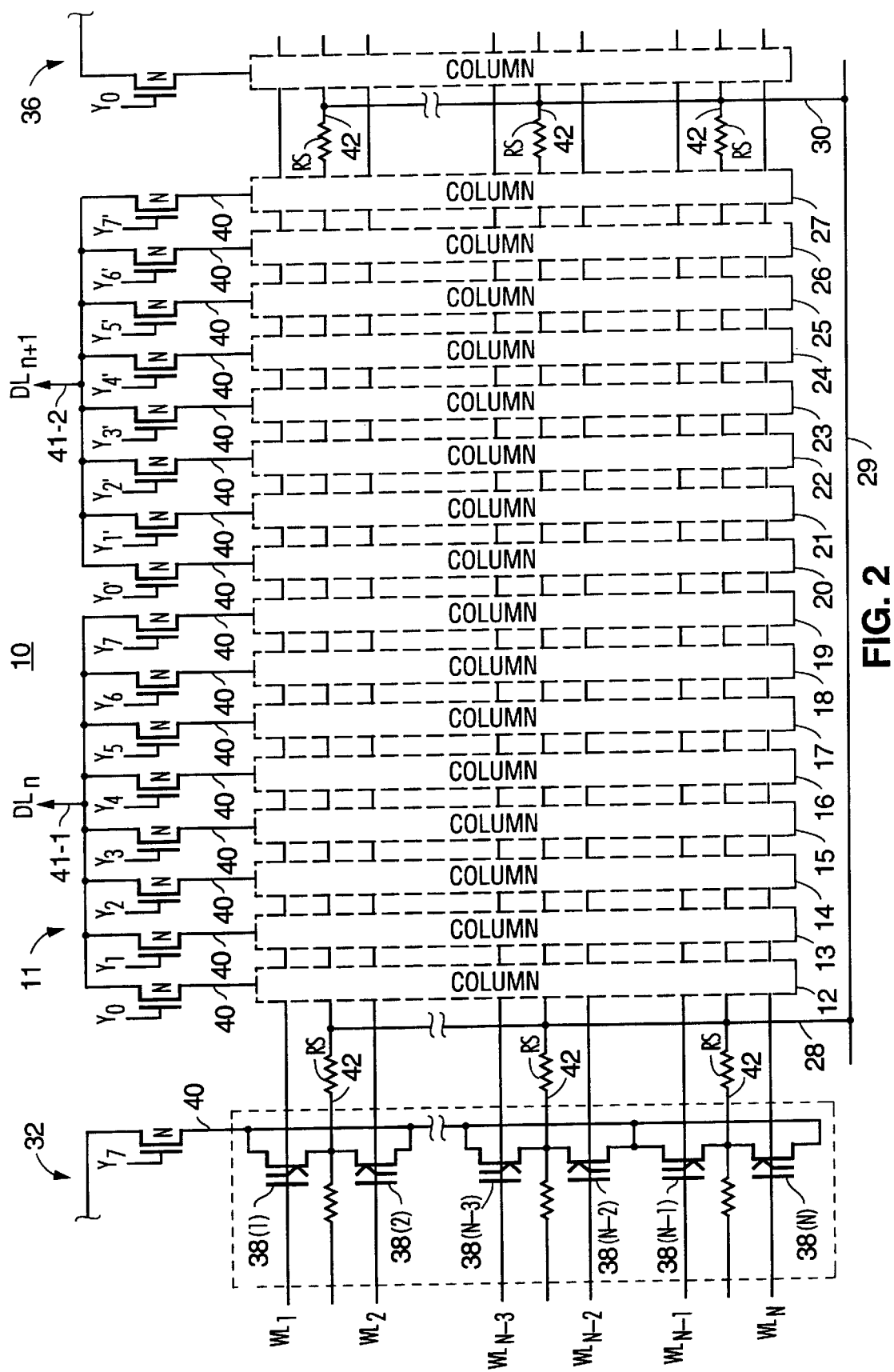
FIG. 2 is a schematic diagram of one embodiment of the decoding arrangement for a NOR type flash memory array in accordance with the present invention.

Referring again to the drawings, FIG. 2 shows a memory array in accordance with the present invention. The array is similar to the prior art array of FIG. 1 in that each sub-array contains 16 columns of cells 38 which are intermediate the adjacent metal source line column segments. However, the select transistors N and the associated select signals Y are implemented such that two cells can be read at the same time within one sub-array and two cells can be programmed at the same time within one sub-array. Columns 12–19 of sub-array 11 have their respective bit lines 40 configured so that the bit lines can be selectively coupled to a first data line $DL_N$ and columns 20–27 of the sub-array have their bit lines 40 configured so that these bit lines can be selectively coupled to a second data line $DL_{N+1}$.

During a read operation, a predetermined select signal $Y_N$ is made active as is a corresponding signal $Y_{N'}$. Typically, select signals $Y_N$ and $Y_{N'}$ are the same signal. Assume for example, that a cell in column 13 is to be read together with a cell in column 21. Both signals $Y_1$ and $Y_{1'}$ are made active thereby connecting the associated bit lines 40 to the read voltages on lines 41-1 and 41-2, respectively, connected to separate data lines $DL_N$ and $DL_{N+1}$. In this manner, 2 bits can be read out of each of the sub-arrays. Thus, it is possible to read out a 16 bit word from an array having only 8 metal source line column segments.

Programming is accomplished in a similar manner in that 2 cells can be programmed in a single sub-array at the same time. The two cells are addressed and the appropriate voltages are applied for programming. Again, the number of cells which can be accessed is increased without increasing the number of metal source line column segments.

In order to increase the performance of the FIG. 2 array, the decoder transistors N and the associated select signals $Y_N$ and $Y_{N'}$ should be implemented so that the spacing between the two columns of cells being read or programmed is optimized so to reduce the source line resistance. Preferably, if there are N number of columns between metal source lines then the columns in the sub-array containing the cells to be read and/or programmed at the same time should be spaced N/2 columns apart. The sub-array 11 of FIG. 2 and the associated decoding transistors N and select signal $Y_N$ and $Y_{N'}$ are arranged in this manner. For example, if select signal $Y_3$ and $Y_{3'}$ go active in a read or program operation, cells in columns 15 and 23 are selected, with such columns having the optimized separation.

Figure 3A:
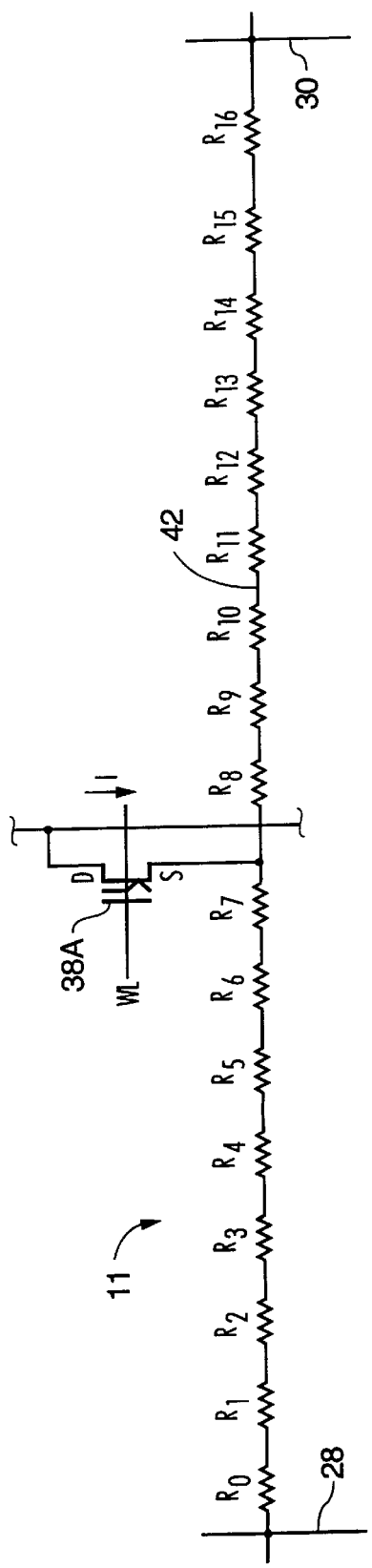
FIG. 3A schematically illustrates the effective resistance of conventional memory array for a section of a word line between a pair of metal source line segments.

The reduction in the number of metal column source lines is achieved with little increase in source line resistance. This can be illustrated by comparing the FIG. 1 prior art array with the array of the present invention as shown in FIG. 2. FIG. 3A represents an equivalent circuit of the FIG. 1 prior art array. The center cell 38A from column 19 of sub-array 11 is selected for reading, since this is the worst case location when considering source line resistance. The horizontal connection of resistances $R_0$–$R_{16}$ between the metal source lines 28 and 30 each represent the lump resistance of the diffused semiconductor source lines $R_S$ and the memory cell diffusion resistance of the cells $R_D$ located in the same row as the selected cell. These resistances $R_S$ and $R_d$ are assumed to be of equal value and will be referred to collectively as $R_N$. This assumption is made because the length and width of the diffusion in the array $V_{SS}$ connection is very similar in length and width to the $V_{SS}$ diffusion in the memory cell. Assuming that the cell 38A being read is an erased cell, current I represents the cell current that will flow when the cell is addressed.

Figure 3B:
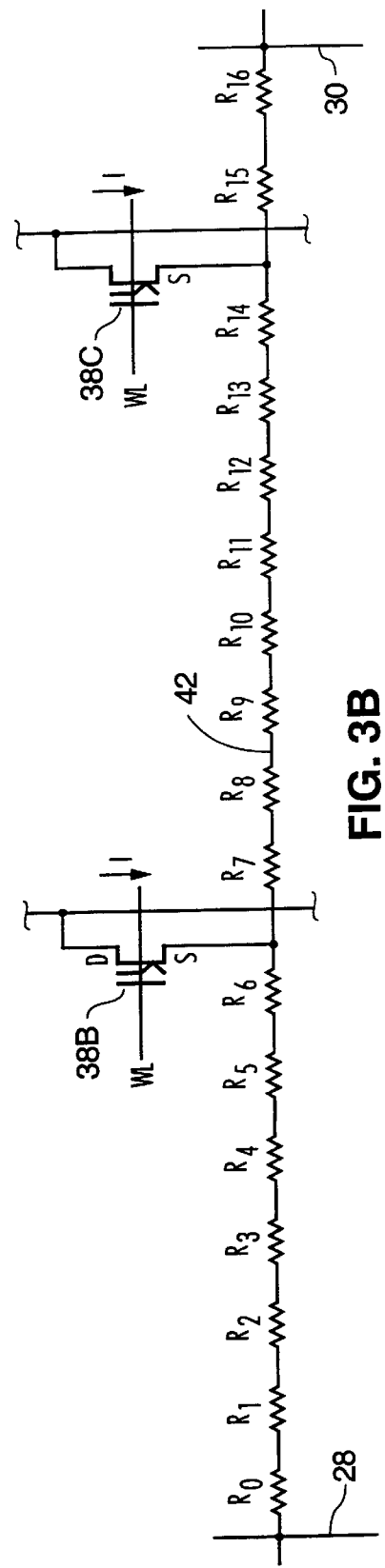
FIG. 3B illustrates the effective resistance for a section of a word line between a pair of metal source line column segments in accordance with the present invention.

FIG. 3B is an equivalent circuit of the FIG. 2 array of the present invention. The near center cell 38B of the sub-array (column 18 of FIG. 2) is being read to establish worst case conditions. The near center cell 38B is assumed to be in an erased state and is drawing a cell current I equal to current I of cell 38A of FIG. 3A. In addition, a second cell 38C in the same row is being read. Cell 38C is located 8 columns away (column 26 of FIG. 2) from the other cell 38B being read.

Figure 4:
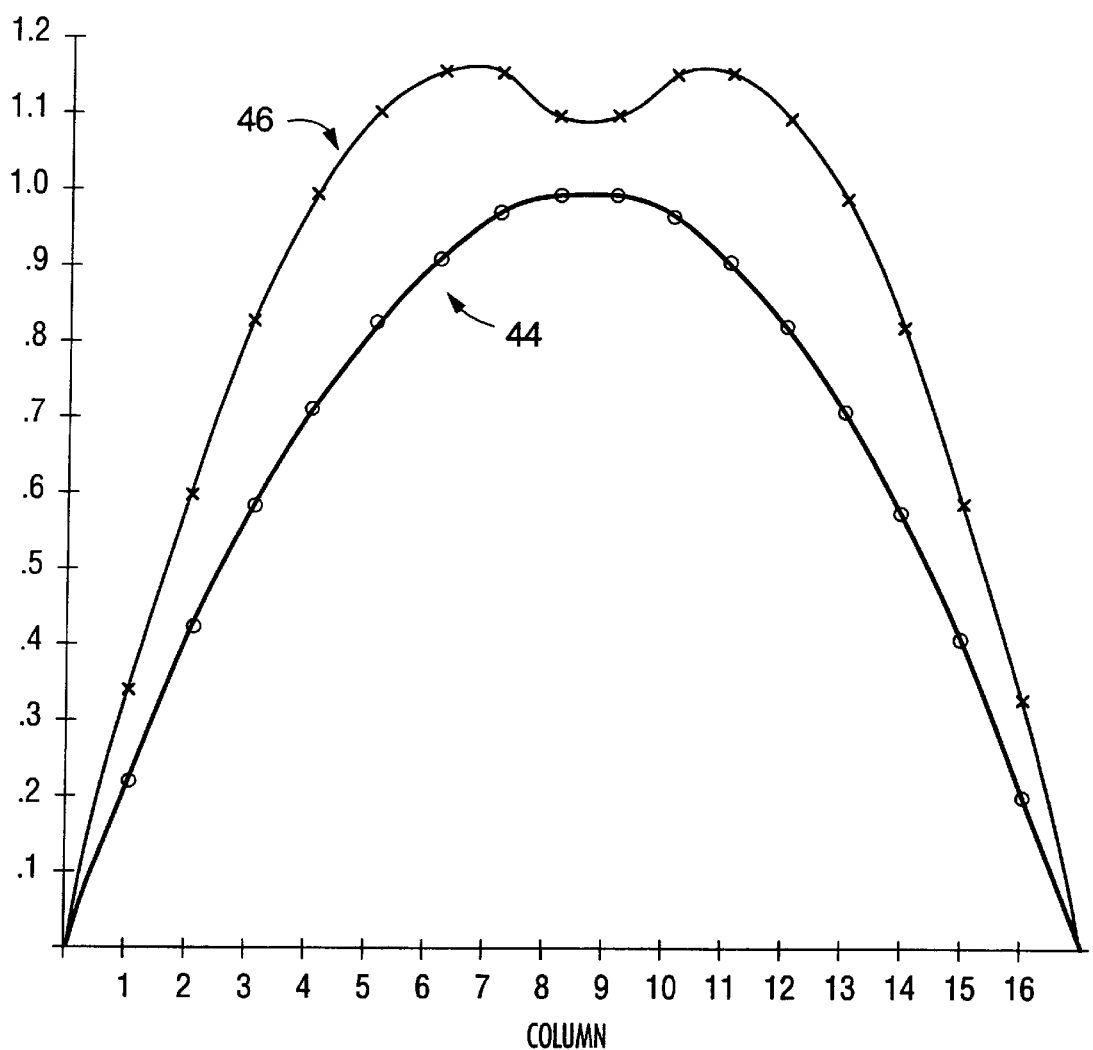
FIG. 4 is a comparison of the relative effective resistances of FIGS. 3A and 3B.

In the case of the FIG. 1/3A array, the maximum equivalent source resistance is the parallel combination of $8R_N$ and $9R_N$ for an effective resistance of $4.24R_N$. In the case of the FIG. 2/3B array of the present invention, the effective resistance is $4.94R_N$. FIG. 4 is a graph comparing the effective normalized source resistances versus the column selected (1–16), with curve 44 representing the prior art array and curve 46 representing the array of the present invention. The worst case increase of only 16.7% for the near center columns 6, 7, and 10, 11 for the present invention over the worst case center columns 8 and 9 of the prior art is not so great as to significantly interfere with memory reading or programming operations and in many cases the reduction in die array area more than justifies this trade-off.

Thus, a novel memory array has been disclosed. Although the array has been described in some detail, it is to be understood that certain changes can be made by those skilled in the art without departing from the spirit and scope of the invention as defined by the appended claims. For example, the invention has applicability to memory arrays other than flash memory arrays, such as RAM, SRAM and ROM. Also, the present invention has applicability where the drains, rather than sources, are grounded.

What is claimed is:

1. The method of accessing an array of memory cells comprising:
    arranging an array of non-volatile memory cells, with each cell including a source, a drain, a channel region intermediate the source and drain, a floating gate disposed over the channel region and insulated from the channel region and a control gate disposed over the floating gate and insulated from the floating gate, with the cells in a plurality of rows and columns, with the cells located in one of the rows having their control gates connected to a common word line and with the cells located in a particular one of the columns having their drains connected to a common bit line and with all of the cells of the array having their sources connected to a common source connection, with the common source connection including;
    connecting the sources of the cells located in at least one of the rows together with a plurality of doped semiconductor source lines;
    connecting together the doped source lines with a metal source line column segments disposed generally parallel to the bit lines with the metal source line column segments being spaced N number of cell columns apart so as to define a plurality of sub-arrays of the cells, with each sub-array having N number of columns; and
    accessing at least two cells in one of the sub-arrays at the same time for the purpose of reading at least two cells.

2. The method of claim 1 including the step of accessing at least two cells in one of the sub-arrays at the same time for the purpose of programming at least two cells.

3. The method of claim 2 including the step of generating select signals to turn on simultaneously at least two select transistors associated with one of the sub-arrays, a separate transistor being coupled to each of the bit lines of the array.

4. The method of claim 3, where there are sixteen columns of cells including the step of accessing cells at the same time for reading and programming which are spaced apart from each other.

5. The method of claim 3 including the step of accessing cells at the same time for reading and programming which are located in separate columns of the sub-array, N/2 number of columns apart.

6. The method of claim 5 including the step of connecting adjacent ones of the metal source line column segments by a metal source line structure which includes a metal line disposed generally parallel to the word lines.

7. The method of claim 6 wherein the cells are flash memory cells.

8. A method of accessing an array of flash memory cells arranged in a plurality of rows and a plurality of columns, having
    a word line associated with each of the cell rows which connect control gates of the cells in associated rows together,
    a bit line associated with each of the cell columns which connect the drains of the cells all together in the associated column; and
    an interconnection structure which interconnects the sources of the cells of the array together, the interconnection structure including doped semiconductor lines for connecting together at least some of the sources and including a metal line structure connected in parallel with the semiconductor lines, with the metal line structure including metal column segments generally disposed in parallel with the bit lines and spaced every N number of cell columns so as to define a sub-array of N number of cell columns intermediate adjacent ones of the metal column segments,
    comprising the step of:
    accessing at least two cells at the same time in one of the sub-arrays during a single read operation, with at least two cells being located in different ones of the cell columns of the sub-array.

9. The method of claim 8 including the step of accessing at least two cells in a single programming operation.

10. The method of claim 9 wherein there are cell columns in each of the cell sub-arrays and including the step of accessing two cells in spaced apart columns.

11. A method of accessing a memory array for use in a memory system having
    an array of flash memory cells arranged in a plurality of rows and a plurality of columns;
    a word line associated with each of the cell rows which connect control gates of the cells in associated rows together;
    a bit line associated with each of the cell columns which connect the sources of the cells all together in the associated columns;
    an interconnection structure which interconnects the drains of the cells of the array together, the interconnection structure including doped semiconductor lines for connecting together at least some of the drains and including a metal line structure connected in parallel with the semiconductor lines, with the metal line structure including metal column segments generally disposed in parallel with the bit lines and spaced every N number of cell columns so as to define a sub-array of N number of cell columns intermediate adjacent ones of the metal column segments;
    comprising the step of:
    accessing at least two cells at the same time in one of the sub-arrays during a single read operation, with at least two cells being located in different ones of the cell columns of the sub-array.

12. The method of claim 11 including the step of accessing at least two cells in a single programming operation.

13. The method of claim 12 wherein there are sixteen number of cell columns in each of the cell sub-arrays and including the step of accessing two cells in spaced apart columns.

14. A method of accessing a memory array having an array of memory cells, with each cell including a source, a drain, a channel region intermediate the source and drain, and a gate disposed over the channel region with the cells being arranged in a plurality of rows and columns, with the cells located in one of the rows having their gates connected to a common word line and with the cells located in a particular one of the columns having their drains connected to a common bit line and with all of the cells of the array having their sources connected to a common source connection, with the common source connection including a plurality of doped semiconductor source lines which connect the sources of the cells located in one of the rows together, and a metal source line structure including a plurality of metal source line column segments disposed generally parallel to the bit lines which connects together the doped source lines, with the metal source line column segments being spaced N number of cell columns apart so as to define a plurality of sub-arrays of the cells, with each sub-array having N number of columns; comprising the step of:

accessing at least two cells in one of the sub-arrays at the same time for the purpose of reading at least two cells.

15. The method of claim 14 including a separate select transistor coupled to each of the bit lines of the array and including the step of generating select signals to turn on at least two of the select transistors associated with one of the sub-arrays at the same time.

16. The method of claim 15 wherein there are sixteen columns of cells in the sub-arrays and including the step of accessing the cells at the same time for reading, which are spaced apart from each other.

17. The method of claim 15 including the step of accessing the cells accessed at the same time for reading which are located in separate columns of the sub-array N/2 number of columns apart.

18. The method of claim 17 wherein the metal source line structure includes a metal line disposed generally parallel to the word lines and including the step of connecting adjacent ones of the metal source line column segments with the metal line.

19. A method of accessing a memory array for use in a memory system which includes an array of memory cells in a plurality of rows and columns, with the cells located in one of the rows being connected to a common word line, and with the cells located in a particular one of the columns being selectively connected to a common bit line by the word line and with all of the cells of the array having a common $V_{SS}$ connection; and wherein the common $V_{SS}$ connection includes a plurality of doped semiconductor $V_{SS}$ connections which connect the cells located in at least one of the rows together, and includes a metal $V_{SS}$ line structure including a plurality of metal line column segments disposed generally parallel to the bit lines which connects together the $V_{SS}$ connections, with the metal $V_{SS}$ line column segments being spaced N number of cell columns apart so as to define a plurality of sub-arrays of the cells, with each sub-array having N number of columns;

comprising the step of accessing at least two cells in one of the sub-arrays at the same time for the purpose of reading at least two cells.

20. The method of claim 19 wherein there are sixteen columns of cells in the sub-arrays and including the step of accessing the cells which are spaced apart from each other at the same time for reading and writing.

21. The method of claim 19 including the step of accessing the cells at the same time for reading and writing which are located in separate columns of the sub-array N/2 number of columns apart.

22. The method of claim 20 wherein the metal source line structure includes a metal line disposed generally parallel to the word lines and including the step of connecting adjacent ones of the metal source line column segments.

23. A method of accessing a memory array for use in a memory system which includes;

an array of non-volatile memory cells, with each cell including a source, a drain, a channel region intermediate the source and drain, a floating gate disposed over the channel region and insulated from the channel region and a control gate disposed over the floating gate and insulated from the floating gate, with the cells being arranged in a plurality of rows and columns, with the cells located in one of the rows having their control gates connected to a common word line and with the cells located in a particular one of the columns having their drains connected to a common bit line and with all of the cells of the array having their sources connected to a common source connection, with the common source connection including a plurality of doped semiconductor source lines which connect the sources of the cells located in at least one of the rows together, and a metal source line structure including a plurality of metal source line column segments disposed generally parallel to the bit lines which connects together the doped source lines, with the metal source line column segments being spaced N number of cell columns apart so as to define a plurality of sub-arrays of the cells, with each sub-array having N number of columns;

comprising the step of;

accessing at least two cells in one of the sub-arrays at the same time for the purpose of reading at least two cells.

24. A method of accessing a memory system which comprises an array of flash memory cells arranged in a plurality of rows and a plurality of columns;

a word line associated with each of the cell rows which connect control gates of the cells in associated rows together;

a bit line associated with each of the cell columns which connect the drains of the cells all together in the associated column; and an interconnection structure which interconnects the sources of the cells of the array together, the interconnection structure including doped semiconductor lines for connecting together at least some of the sources and including a metal line structure connected in parallel with the semiconductor lines, with the metal line structure including metal column segments generally disposed in parallel with the bit lines and spaced every N number of cell columns so as to define a sub-array of N number of cell columns intermediate adjacent ones of the metal column segments;

comprising the step of:

accessing at least two cells at the same time in one of the sub-arrays during a single read operation, with at least two cells being located in different ones of the cell columns of the sub-array.

25. A method of using a memory array for use in a memory system which includes, an array of flash memory cells arranged in a plurality of rows and a plurality of columns;

a word line associated with each of the cell rows which connect control gates of the cells in associated rows together;

a bit line associated with each of the cell columns which connect the sources of the cells all together in the associated columns; and an interconnection structure which interconnects the drains of the cells of the array together, the interconnection structure including doped semiconductor lines for connecting together at least some of the drains and including a metal line structure connected in parallel with the semiconductor lines, with the metal line structure including metal column segments generally disposed in parallel with the bit lines and spaced every N number of cell columns so as to define a sub-array of N number of cell columns intermediate adjacent ones of the metal column segments;

comprising the step of accessing at least two cells at the same time in one of the sub-arrays during a single read operation, with at least two cells being located in different ones of the cell columns of the sub-array.

26. A method of utilizing a memory array for use in a memory system which includes, an array of memory cells, with each cell including a source, a drain, a channel region intermediate the source and drain, and a gate disposed over the channel region with the cells being arranged in a plurality of rows and columns, with the cells located in one of the rows having their gates connected to a common word line and with the cells located in a particular one of the columns having their drains connected to a common bit line and with all of the cells of the array having their sources connected to a common source connection, with the common source connection including a plurality of doped semiconductor source lines which connect the sources of the cells located in one of the rows together, and a metal source line structure including a plurality of metal source line column segments disposed generally parallel to the bit lines which connects together the doped source lines, with the metal source line column segments being spaced N number of cell columns apart so as to define a plurality of sub-arrays of the cells, with each sub-array having N number of columns;

comprising the step of using a decoder which accesses at least two cells in one of the sub-arrays at the same time for the purpose of reading at least two cells.

27. A method of accessing a memory array for use in a memory system which includes, an array of memory cells with the cells being arranged in a plurality of rows and columns, with the cells located in one of the rows being connected to a common word line, and with the cells located in a particular one of the columns being selectively connected to a common bit line by the word line and with all of the cells of the array having a common $V_{SS}$ connection;

wherein the common $V_{SS}$ connection includes a plurality of doped semiconductor $V_{SS}$ connections which connect the cells located in at least one of the rows together, and includes a metal $V_{SS}$ line structure including a plurality of metal line column segments disposed generally parallel to the bit lines which connects together the $V_{SS}$ connections, with the metal $V_{SS}$ line column segments being spaced N number of cell columns apart so as to define a plurality of sub-arrays of the cells, with each sub-array having N number of columns;

comprising the step of accessing at least two cells in one of the sub-arrays at the same time for the purpose of reading at least two cells.

* * * * *

UNITED STATES PATENT AND TRADEMARK OFFICE
CERTIFICATE OF CORRECTION

PATENT NO. : 5,867,424
DATED : Feb. 2, 1999
INVENTOR(S) : Michael S. Briner

It is certified that error appears in the above-identified patent and that said Letters Patent is hereby corrected as shown below:

In the Abstract, line 17, please delete "a" following "with".

At Col. 5, line 50, please insert --structure including a plurality of metal source line-- after "line".

Signed and Sealed this

Twenty-third Day of November, 1999

Attest:

Q. TODD DICKINSON

*Attesting Officer*   *Acting Commissioner of Patents and Trademarks*